(12) United States Patent
Yamano

(10) Patent No.: US 7,790,359 B2
(45) Date of Patent: Sep. 7, 2010

(54) PLATING METHOD

(75) Inventor: Takaharu Yamano, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 987 days.

(21) Appl. No.: 11/072,724

(22) Filed: Mar. 4, 2005

(65) Prior Publication Data

US 2005/0202346 A1    Sep. 15, 2005

(30) Foreign Application Priority Data

Mar. 11, 2004    (JP)    ............... 2004-069421

(51) Int. Cl.
*H01L 21/00*    (2006.01)
(52) U.S. Cl. ............... 430/313; 430/394; 430/311; 430/315
(58) Field of Classification Search ............ None
See application file for complete search history.

(56) References Cited

U.S. PATENT DOCUMENTS 6,550,136 B1 *    4/2003    Hata et al. ............ 29/846

2003/0091940 A1 *    5/2003    Nakao ............ 430/322

FOREIGN PATENT DOCUMENTS

| JP | 08-170198 | | 7/1996 |
| JP | 11-204459 | | 7/1999 |
| JP | 2001-156093 | * | 6/2001 |
| JP | 2003-031768 | | 1/2003 |

* cited by examiner

*Primary Examiner*—Daborah Chacko Davis
(74) *Attorney, Agent, or Firm*—Ladas & Parry LLP

(57) ABSTRACT

A method of forming an electrode on a semiconductor wafer by plating is disclosed that is able to reliably prevent leakage of a plating solution during the plating process. The plating method comprises the steps of forming a conductive layer on a semiconductor wafer; forming a negative resist layer on the conductive layer; exposing a center portion of the negative resist layer; exposing a peripheral region of the negative resist layer after the step of exposing the center portion of the negative resist layer; developing the exposed negative resist layer to form a predetermined plating pattern; and performing plating on the plating pattern.

4 Claims, 16 Drawing Sheets

FIG.16A
FIG.16B
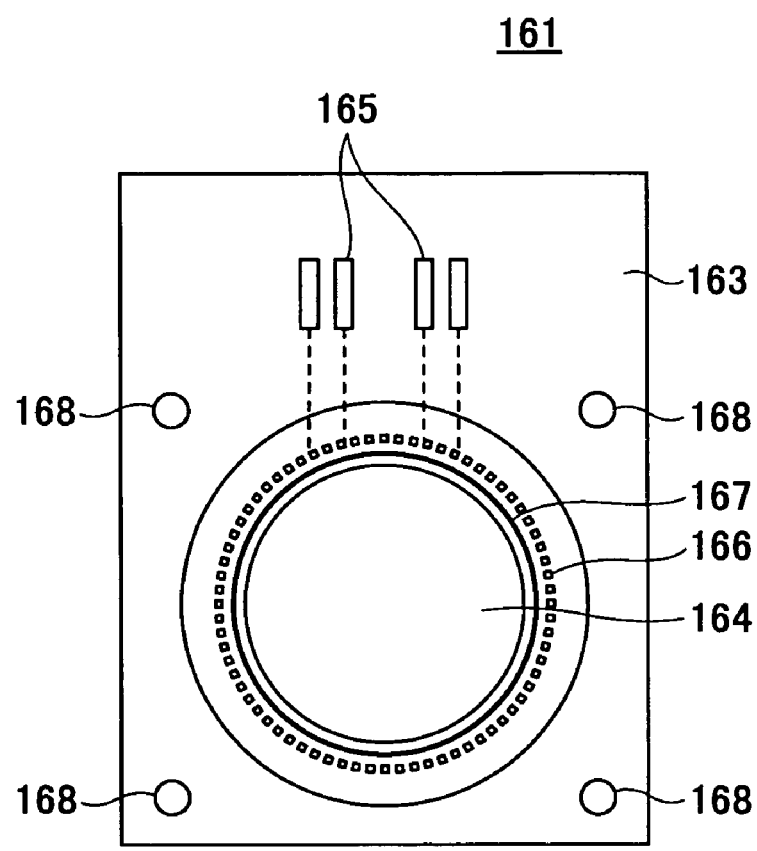
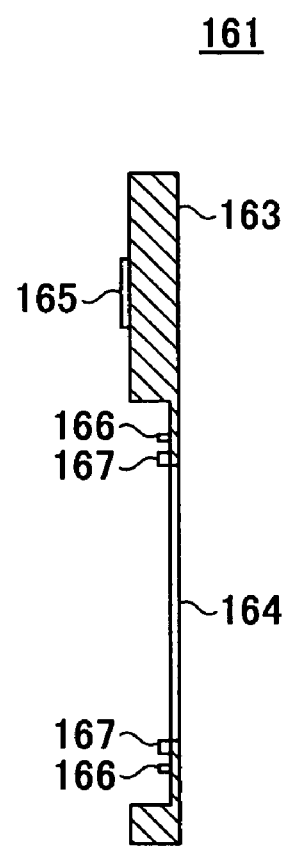

162

162

PLATING METHOD

BACKGROUND OF THE INVENTION

1. Field of the Invention

The present invention relates to a method of forming a rerouting pattern by plating on a semiconductor wafer.

2. Description of the Related Art

In a semiconductor product, for example, a Super Chip-Size Package (Super CSP) product, conductive posts (for example, copper posts) or rerouting patterns are formed by plating on a surface of a semiconductor chip cut out from a semiconductor wafer. Also, in the process of forming a semiconductor product having bumps, the conductive posts or the rerouting patterns are formed. Prior to the plating treatment, plating electrodes (electric power feeding layer) are formed on the semiconductor wafer.

For example, Japanese Laid Open Patent Application No. 2003-031768 (page 5, and FIG. 1) discloses background art of this technology.

FIG. 1 through FIG. 6 illustrate the process of forming rerouting patterns in the related art.

FIG. 1 is a top view of a semiconductor substrate.

FIG. 2 is a cross-sectional view of the semiconductor substrate in FIG. 1 along the line AA'.

In step one, a conductive layer is formed. Specifically, as illustrated in FIG. 1 and FIG. 2, a conductive layer 610 is formed on a semiconductor wafer 600 by sputtering. Alternatively, an insulating layer formed from polyimide or epoxy may be disposed on the semiconductor wafer 600, and the conductive layer 610 may be deposited on the insulating layer.

FIG. 3 is a top view of the semiconductor substrate for explaining the process of forming rerouting patterns continued from FIG. 1.

FIG. 4 is a cross-sectional view of the semiconductor substrate in FIG. 3 along the line AA'.

In step two, a resist layer is formed. Specifically, as illustrated in FIG. 3 and FIG. 4, a negative resist layer 620 is formed on the conductive layer 610. Further, after the step two and before a subsequent step three (described below), a protection film (not illustrated) is disposed on the resist layer 620 to protect the resist layer 620. Here, the resist layer 620 may be either a negative one or a positive one. Below, it is assumed that the resist layer 620 is a negative resist layer.

FIG. 5 is a top view of the semiconductor substrate for explaining the process of forming rerouting patterns continued from FIG. 3.

In step three, exposure is carried out. Specifically, as illustrated in FIG. 5, a reticle pattern (not illustrated) is disposed at a specified position above the negative resist layer 620, and a projection lithography stepper (not illustrated) emits ultraviolet rays onto the negative resist layer 620 through the reticle pattern to expose the negative resist layer 620. After that, the protection film on the negative resist layer 620 is removed.

In the grid area shown in FIG. 5, each cell 700 indicates an area exposed by the projection lithography stepper at one time (referred to as "unit exposure area" below). The projection lithography stepper exposes the cells 700 one by one by using a reticle having a reticle pattern corresponding to the shape of the plating electrodes to be formed (plating pattern).

FIG. 6 is an enlarged perspective view of the semiconductor substrate for explaining the process of forming rerouting patterns continued from FIG. 5. In FIG. 6, developing is executed on the semiconductor substrate after the exposure step as shown in FIG. 5.

As illustrated in FIG. 6, the conductive layer 610 is formed on the semiconductor wafer 600, and the resist layer 620 (dotted portion) is formed on the conductive layer 610.

Because of the exposure step and the developing step, plating patterns (rerouting patterns) 650 are formed in the resist layer 620. In this example, because the resist layer 620 is a negative resist layer, the exposed portions of the resist layer 620 become insoluble or hardly soluble in the developing solution, and the un-exposed portions are removed by developing, resulting in the plating patterns 650. At the position where the plating patterns 650 are formed, the conductive layer 610 is exposed.

After the semiconductor wafer 600 having the plating patterns 650 is mounted on a plating jig, as disclosed in Japanese Laid-Open Patent Application No. 8-170198 (FIG. 1 and FIG. 2), and Japanese Laid-Open Patent Application No. 11-204459 (FIG. 1), the semiconductor wafer 600 is immersed into a plating tank filled with a plating solution and is plated by electro-plating (for example, copper plating). In this process, sealing rubber is arranged in the plating jig, and the sealing rubber is disposed on the periphery of the semiconductor wafer 600 to be liquid-tight. In this way, the plating solution only contacts the plating position of the semiconductor wafer 600, and does not leak out to the back side of the semiconductor wafer 600.

In the above plating process, a specified conductive metal material (for example, copper) is plated in the plating patterns 650; thereby, rerouting patterns are formed in the plating patterns 650. Next, the negative resist layer 620 is removed, and rerouting patterns corresponding to the plating patterns 650 are formed on the semiconductor wafer 600.

Recently, in order to improve electrical characteristics of the rerouting patterns, it has been proposed to increase the thickness of the rerouting pattern formed on the semiconductor wafer 600. In the related art, the resist layer is formed by coating a negative to a positive liquid resist. However, with this method, only a thin resist layer less than 10 μm can be formed, and it is difficult to increase the thickness of the rerouting pattern. For this reason, recently, it has been proposed to use a dry film resist (DFR) to increase the thickness of the rerouting pattern.

However, when a dry film resist thicker than 10 μm is used in the above plating process, even when the sealing rubber is used, it is difficult to prevent leakage of the plating solution, and the plating solution leaks out to the periphery and the back side of the semiconductor wafer 600.

FIG. 7 is an enlarged perspective view of the semiconductor substrate mounted on a plating jig. For convenience of illustration and explanation, only a sealing rubber 635 of the plating jig is shown in FIG. 7.

In FIG. 7, the plating solution contacts the inner side of the sealing rubber 635, and the sealing rubber 635 is arranged so that the plating solution does not leak out to the outside of the sealing rubber 635.

Nevertheless, as described with reference to FIG. 5, in the step of exposure, the cells 700 of the semiconductor wafer 600 are exposes one by one using a reticle. In the process, at the edge of the semiconductor wafer 600, the cells 700 extend out of the semiconductor wafer 600; as a result, these patterns of the reticle cannot be exposed.

Focusing on the edge of the semiconductor wafer 600 in FIG. 7, a groove-like plating pattern 650 at the edge of the semiconductor wafer 600 is in communication with outside through a communication portion 651, in other words, an opening is present on the side surface of the negative or positive resist layer 620. Consequently, in the plating step, the plating solution flows into the communication portion 651 from the inner side 652 of the plating pattern 650, and due to this, in spite of the presence of the sealing rubber 635, the plating solution leaks out to the outside of the sealing rubber 635.

Meanwhile, with a thin negative or positive resist layer 620 (for example, less than 10 μm), when the sealing rubber 635 is pressed on the resist layer 620, the resist layer 620 bends because the resist layer 620 is made from a flexible resin. In addition, when the sealing rubber 635 seals the resist layer 620, the capillary phenomenon occurs, and the sealing rubber 635 is elastically deformed when entering the plating pattern 650. Due to these facts, plating solution leakage does not occur when the resist layer 620 is thin.

SUMMARY OF THE INVENTION

Accordingly, it is a general object of the present invention to solve one or more problems of the related art.

A more specific object of the present invention is to provide a plating method able to reliably prevent leakage of a plating solution.

The present invention provides a plating method comprising the steps of forming a conductive layer on a semiconductor wafer; forming a negative resist layer on the conductive layer; exposing a center portion of the negative resist layer; exposing a peripheral region of the negative resist layer after the step of exposing the center portion of the negative resist layer; developing the exposed negative resist layer to form a predetermined plating pattern; and performing plating on the plating pattern.

According to the present invention, after the center portion of the negative resist layer is exposed, the peripheral region of the negative resist layer is exposed. Therefore, after the step of developing, the negative resist layer remains in the peripheral region. As a result, the plating pattern formed on the negative resist layer is not in the peripheral region, and the negative resist layer remains in the peripheral region functions as a dam to prevent leakage of a plating solution in the plating step.

In an embodiment, the negative resist layer is thicker than 10 μm.

According to the present invention, even when the negative resist layer is thicker than 10 μm, and the obtained plating pattern is thick, it is possible to prevent leakage of the plating solution in the plating step.

In an embodiment, the negative resist layer is formed from a dry film resist.

According to the present invention, when the negative resist layer is formed from a dry film resist, it is possible to easily deposit a negative resist layer thicker than 10 μm on the semiconductor wafer.

In an embodiment, in the step of performing plating, a sealing plating jig is used.

According to the present invention, because a sealing plating jig is used in the step of performing plating, it is possible to prevent leakage of the plating solution in the plating step more effectively.

In an embodiment, in the step of exposing the center portion of the negative resist layer, a projection lithography stepper is used to expose the negative resist layer one unit region at a time.

These and other objects, features, and advantages of the present invention will become more apparent from the following detailed description of the preferred embodiments given with reference to the accompanying drawings.

BRIEF DESCRIPTION OF THE DRAWINGS

FIG. 16A and FIG. 16B are a plan view and a cross-sectional side view, respectively, of the mask jig 161 in the plating jig 160 used in the plating method according to the embodiment of the present invention;

DESCRIPTION OF THE PREFERRED EMBODIMENTS

Below, preferred embodiments of the present invention are explained with reference to the accompanying drawings.

Specifically, descriptions are made of a plating method of forming rerouting pattern on a semiconductor wafer, for example, in a Super Chip-Size Package (Super CSP) semiconductor product.

Figure 8:
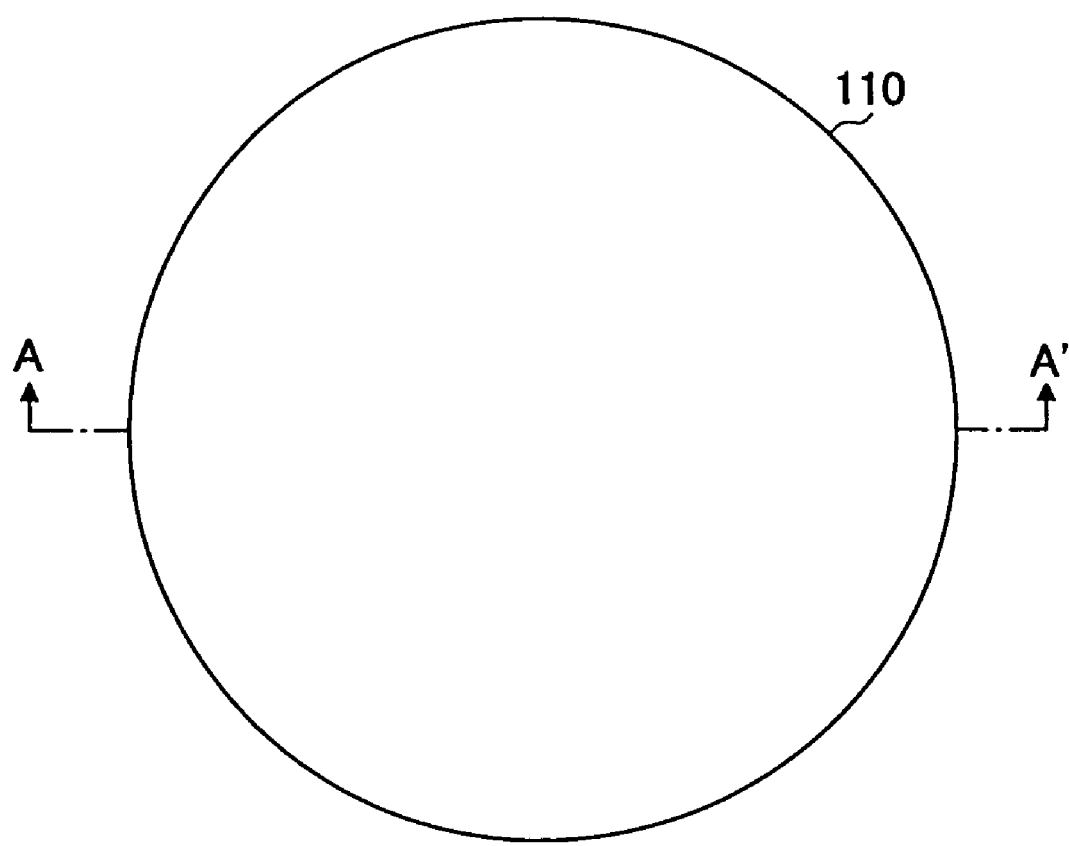
FIG. 8 is a top view of a semiconductor substrate for explaining a plating method according to an embodiment of the present invention.

FIG. 8 is a top view of a semiconductor substrate for explaining a plating method according to an embodiment of the present invention.

Figure 9:
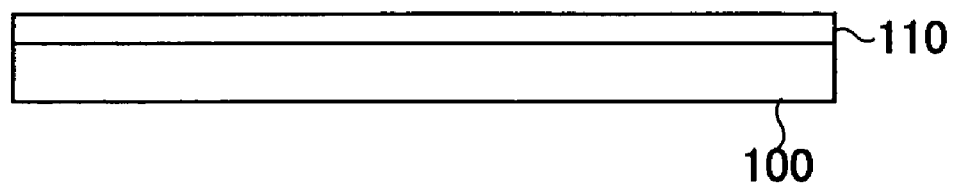
FIG. 9 is a cross-sectional view of the semiconductor substrate in FIG. 8 along the line AA'.

FIG. 9 is a cross-sectional view of the semiconductor substrate in FIG. 8 along the line AA'.

In step one, as illustrated in FIG. 8 and FIG. 9, a conductive layer is formed. Specifically, a conductive layer 110 (for example, copper) for forming rerouting patterns is deposited on a semiconductor wafer 100, for example, a silicon wafer having a diameter of 8 inches (20.32 cm).

The conductive layer 110 may be formed by sputtering, in which ions are sputtered onto the surface of the semiconductor wafer 100 acting as a target by using glow discharge in an environment of argon gas or other discharging gases.

Alternatively, an insulating layer formed from polyimide or epoxy may be disposed on the semiconductor wafer 100, and the conductive layer 110 may be deposited on the insulating layer.

Figure 10:
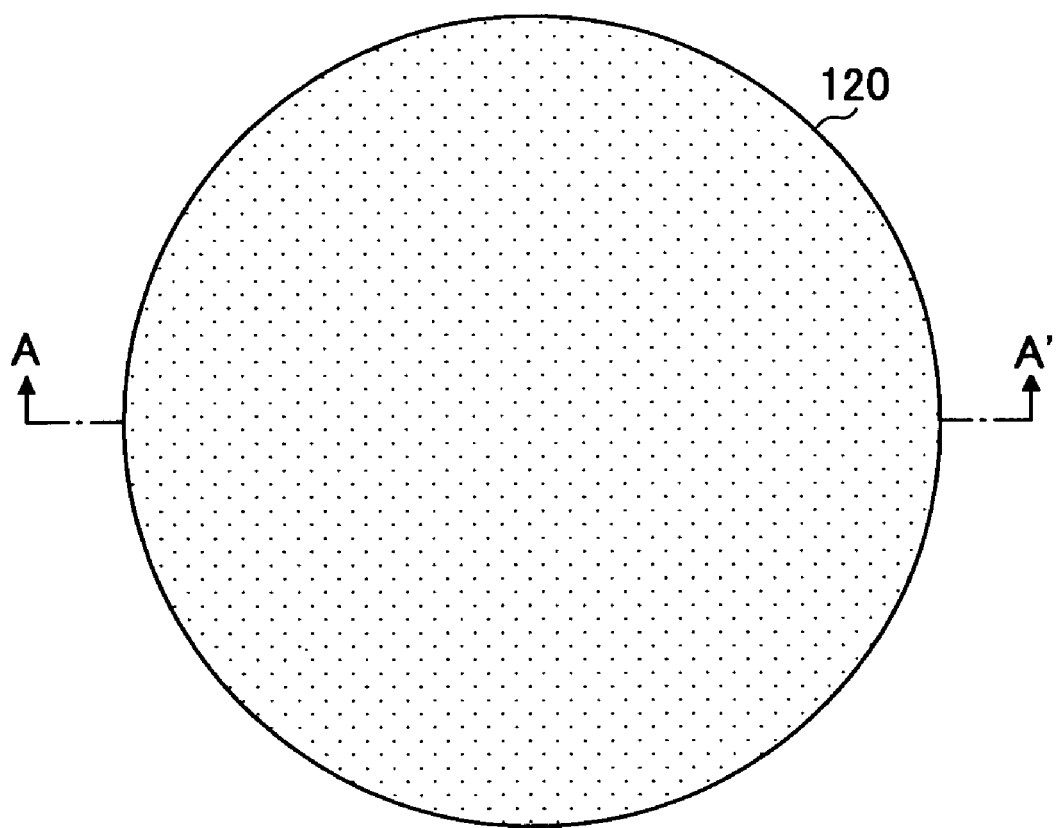
FIG. 10 is a top view of the semiconductor substrate for explaining the plating method of forming the rerouting patterns continued from FIG. 1 according to the embodiment of the present invention.

FIG. 10 is a top view of the semiconductor substrate for explaining the plating method of forming the rerouting patterns continued from FIG. 8 according to the embodiment of the present invention.

Figure 11:
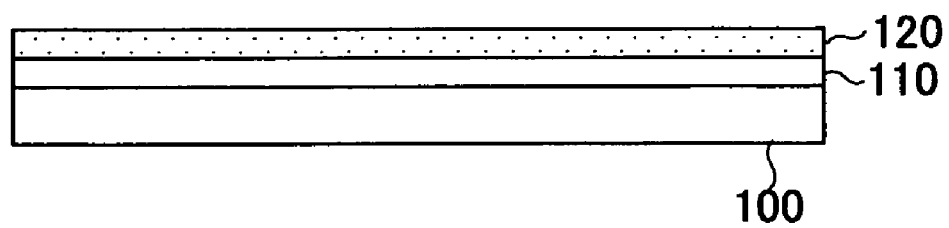
FIG. 11 is a cross-sectional view of the semiconductor substrate in FIG. 3 along the line AA'.

FIG. 11 is a cross-sectional view of the semiconductor substrate in FIG. 10 along the line AA'.

In step two, a resist layer is formed. Specifically, as illustrated in FIG. 10 and FIG. 11, a negative resist layer 120 is formed on the conductive layer 110.

Here, the resist layer 120 may be either a negative one or a positive one. In the present embodiment, it is assumed that the resist layer 120 is a negative resist layer.

The negative resist layer 120 has a characteristic in that the portion of the negative resist layer 120 irradiated by ultraviolet rays becomes insoluble or hardly soluble in a developing solution, and remains on the surface of the conductive layer 110 after being developed.

The negative resist layer 120 is formed by pasting a dry film resist (DFR) on the conductive layer 110. In this case, it is easy to form the negative resist layer 120 thicker than 10 μm. Further, it is also easy to remove the negative resist layer 120 after the plating treatment.

In the present embodiment, a 30 μm thick dry film resist (DFR) is used as the negative resist layer 120. With such a thick negative resist layer 120, it is possible to form rerouting patterns having low resistance and good electrical characteristics.

Figure 12:
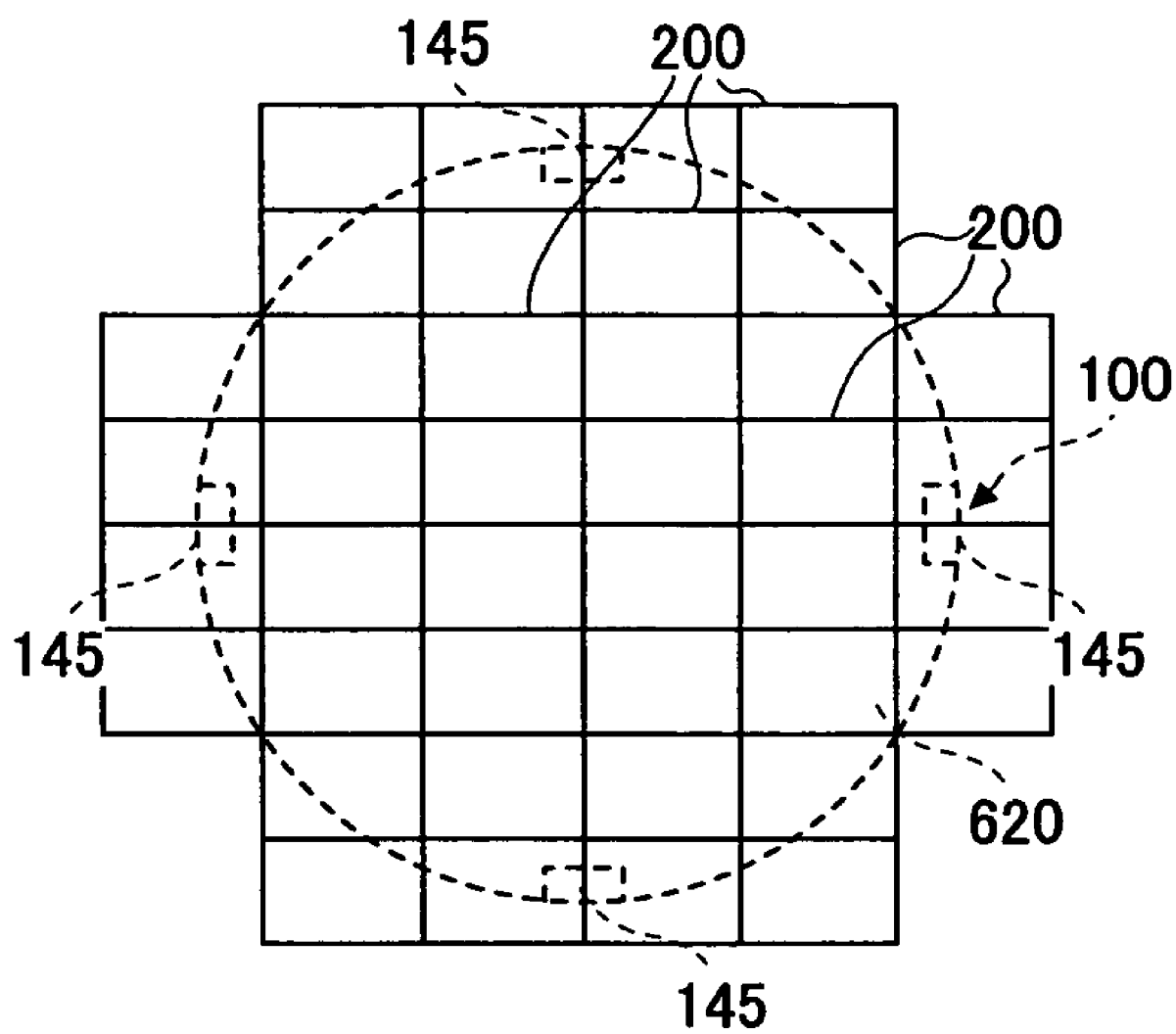
FIG. 12 is a top view of the semiconductor substrate for explaining the plating method of forming rerouting patterns continued from FIG. 11 according to the embodiment of the present invention.

FIG. 12 is a top view of the semiconductor substrate for explaining the plating method of forming rerouting patterns continued from FIG. 11 according to the embodiment of the present invention.

In step three, as illustrated in FIG. 12, the first exposure is carried out. Specifically, a protection film 130, which allows transmission of light for exposure, is applied on the negative resist layer 120 to protect the negative resist layer 120. For example, the protection film 130 is formed by PET (Poly Ethylene Terephthalate).

Next, ink is printed on the protection film 130, which is above a power feeding electrode on the conductive layer 110, to form a light shielding layer 145.

Then, a reticle pattern (not illustrated) is disposed at a specified position above the negative resist layer 120, and a projection lithography stepper (not illustrated) emits ultraviolet rays onto the negative resist layer 120 to expose the negative resist layer 120.

Figure 1:
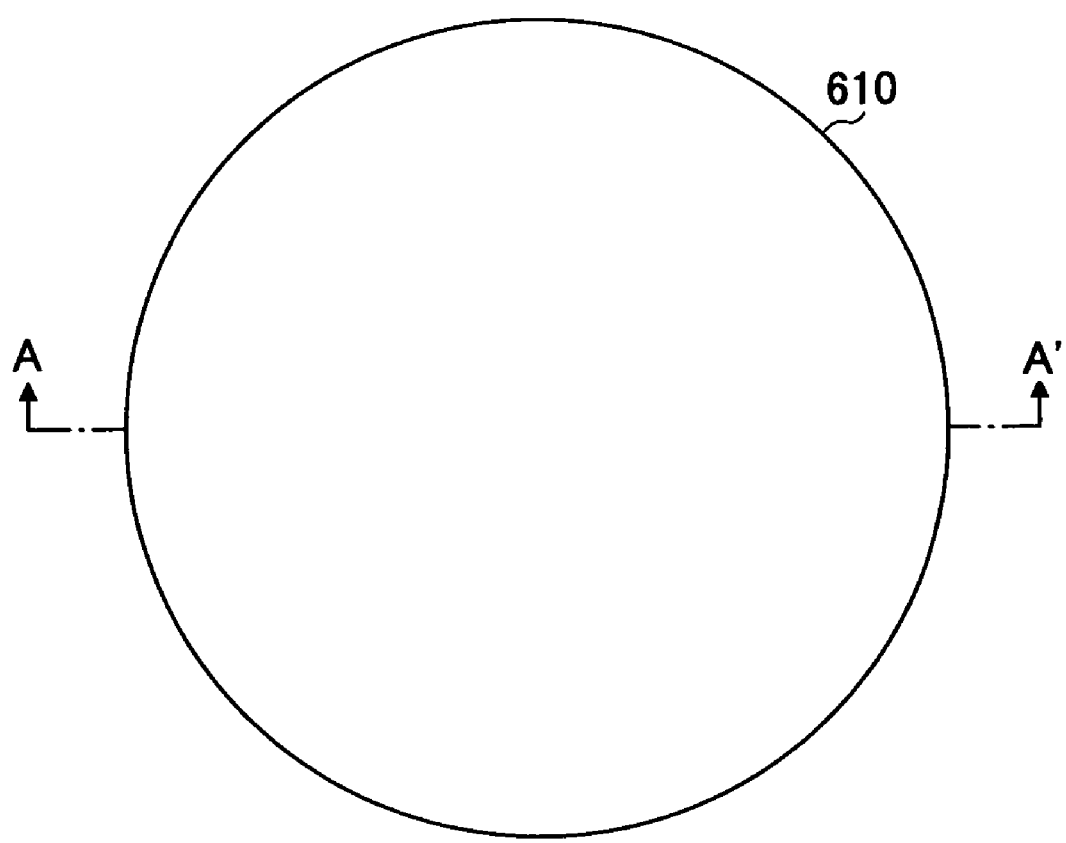
FIG. 1 is a top view of a semiconductor substrate for illustrating the process of forming rerouting patterns in the related art.
Figure 2:
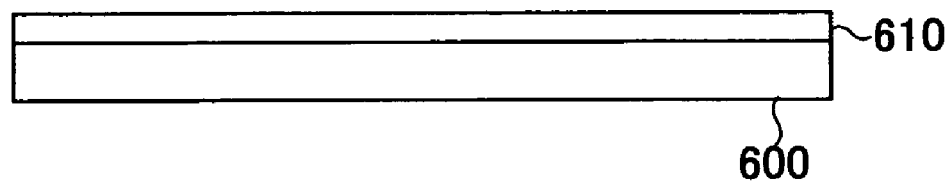
FIG. 2 is a cross-sectional view of the semiconductor substrate in FIG. 1 along the line AA'.
Figure 3:
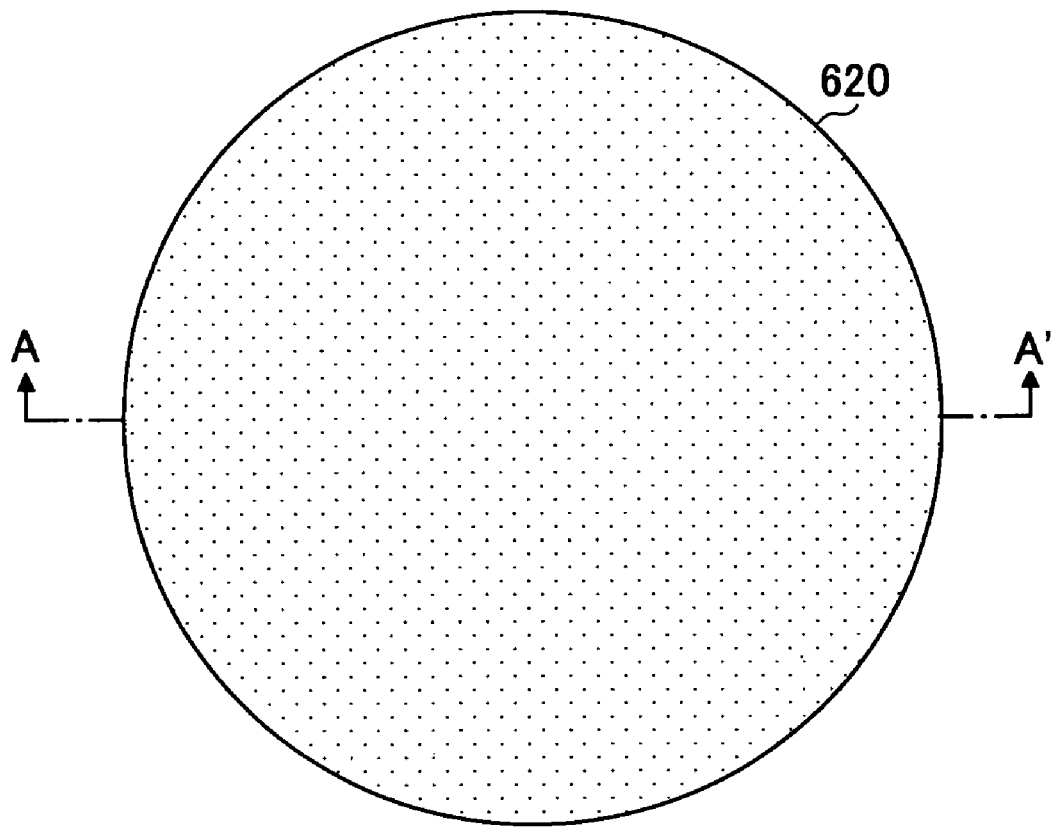
FIG. 3 is a top view of the semiconductor substrate for explaining the process of forming rerouting patterns continued from FIG. 1.
Figure 4:
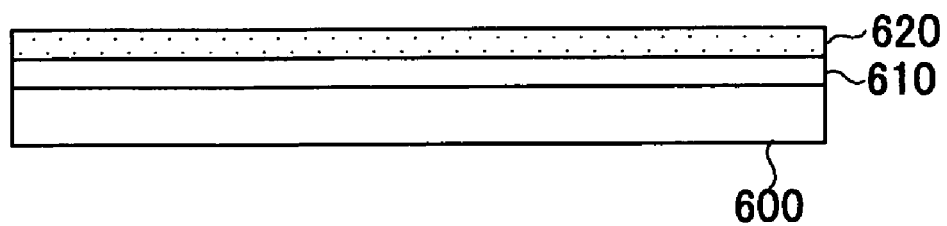
FIG. 4 is a cross-sectional view of the semiconductor substrate in FIG. 3 along the line AA'.
Figure 5:
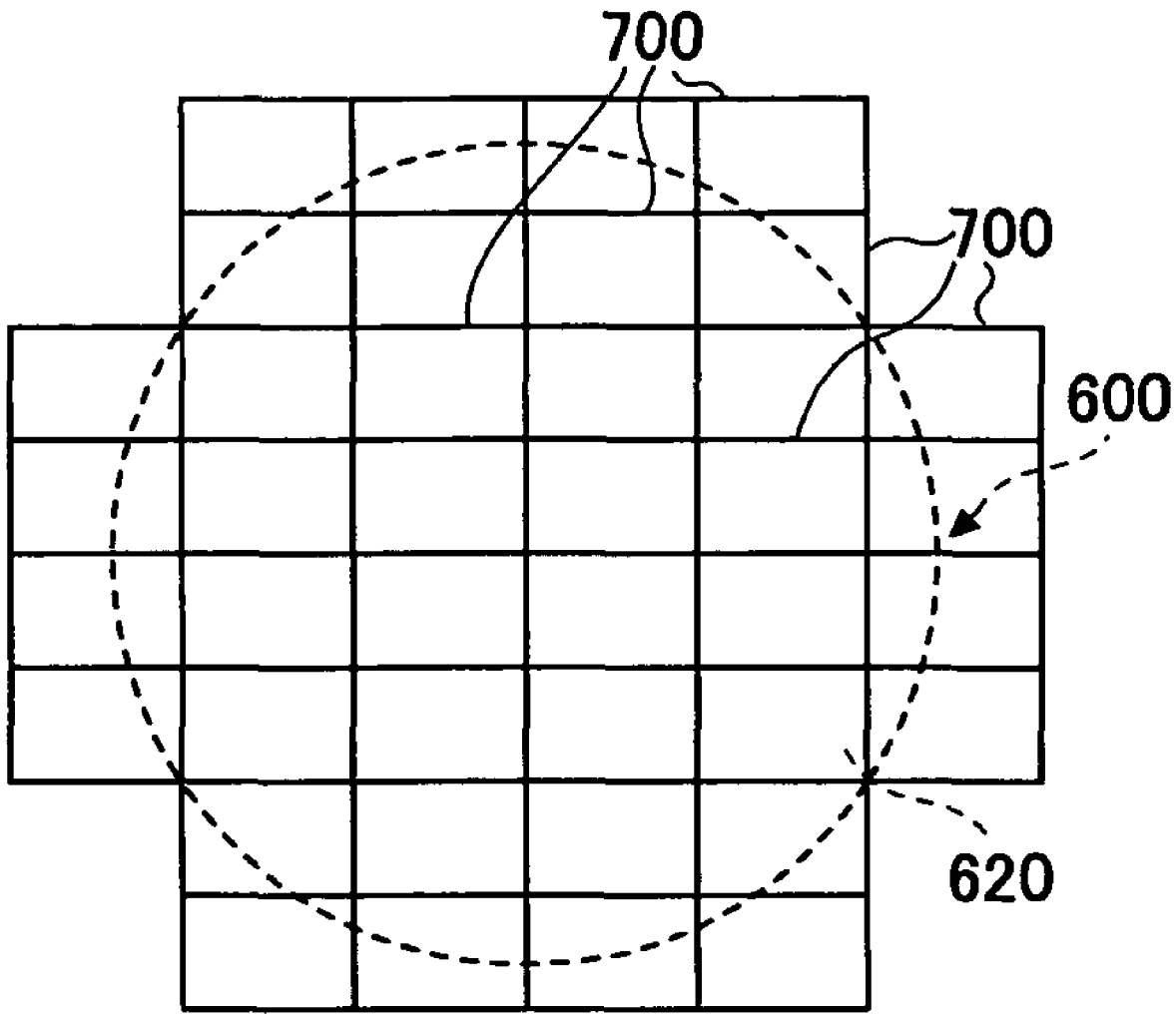
FIG. 5 is a top view of the semiconductor substrate for explaining the process of forming rerouting patterns continued from FIG. 3.
Figure 6:
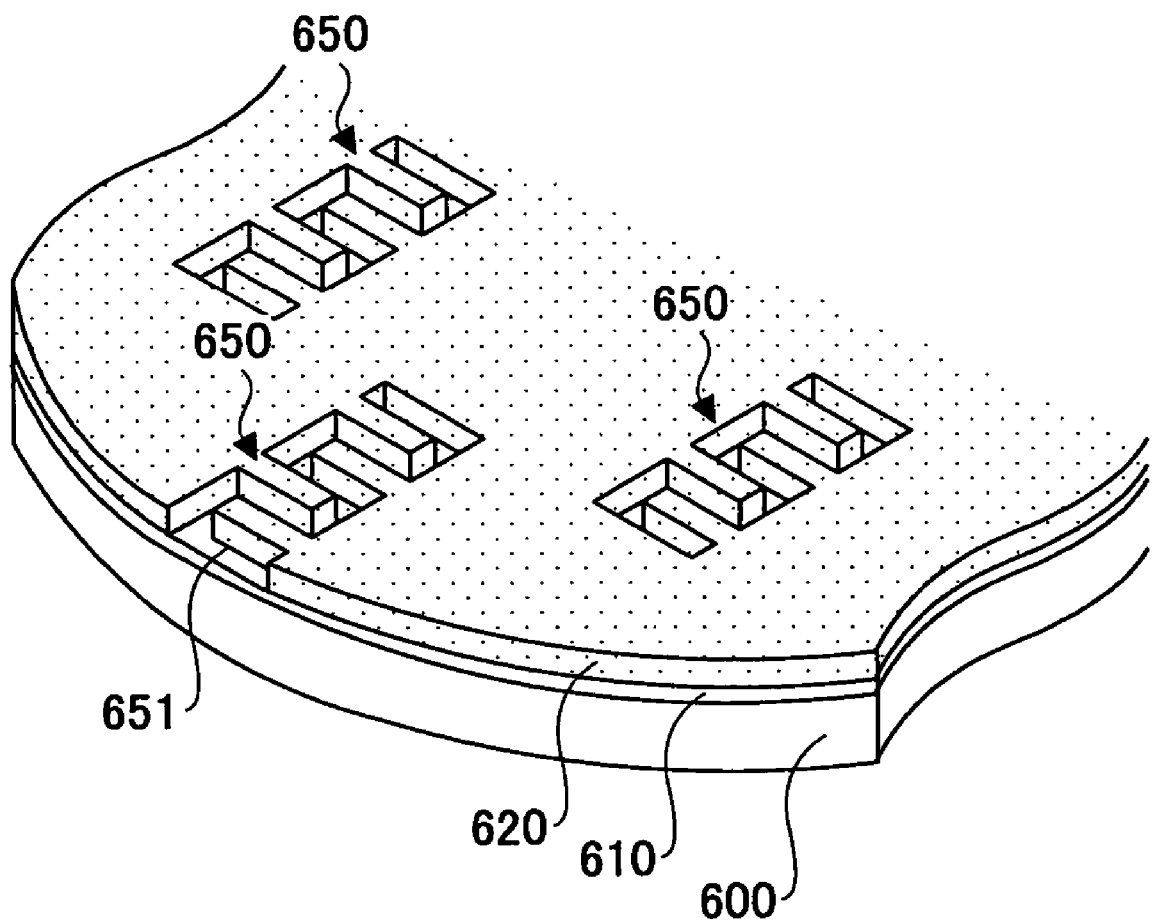
FIG. 6 is an enlarged perspective view of the semiconductor substrate for explaining the process of forming rerouting patterns continued from FIG. 5.
Figure 7:
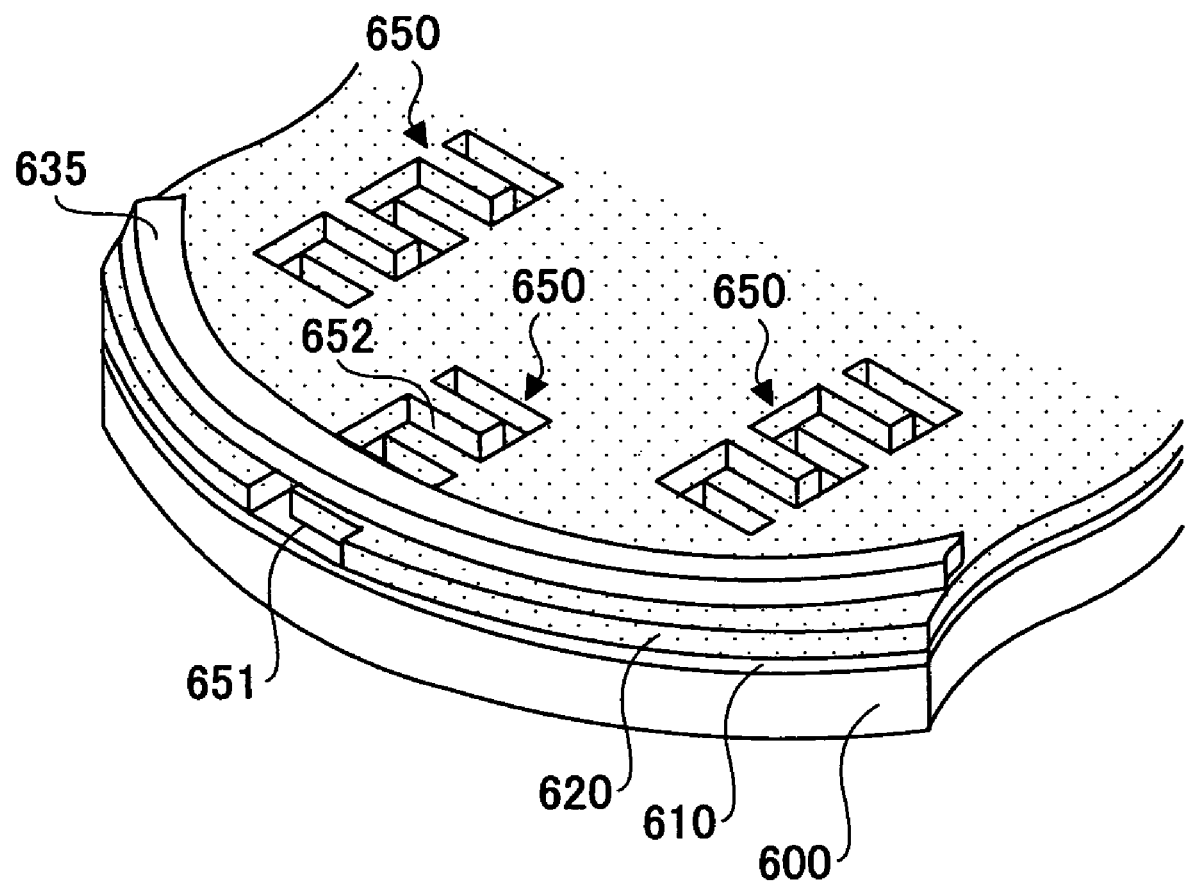
FIG. 7 is an enlarged perspective view of the semiconductor substrate mounted on a plating jig.

In the grid area shown in FIG. 12, each cell 200 indicates an area exposed by the projection lithography stepper at one time (referred to as "unit exposure area" below). The projection lithography stepper exposes the cells 200 one by one. As described with reference to FIG. 5, at the edge of the semiconductor wafer 100, the cells 200 extend out of the semiconductor wafer 100, thus, these patterns of the reticle cannot be exposed.

By irradiation of light onto the negative resist layer 120 by the projection lithography stepper, the negative resist layer 120 is exposed through the reticle, and portions of the negative resist layer 120 irradiated by the ultraviolet rays through the reticle becomes insoluble or hardly soluble in the developing solution. But, portions of the negative resist layer 120 shielded by the reticle are not exposed and remains soluble in the developing solution, namely, portions of the negative resist layer 120 corresponding to positions where the plating pattern 150 is to be formed, and portions of the negative resist layer 120 corresponding to positions of a power feeding electrode 115 for supplying electric power during electro-plating and where the light shielding layer 145 is formed presently remains soluble to the developing solution.

Figure 13:
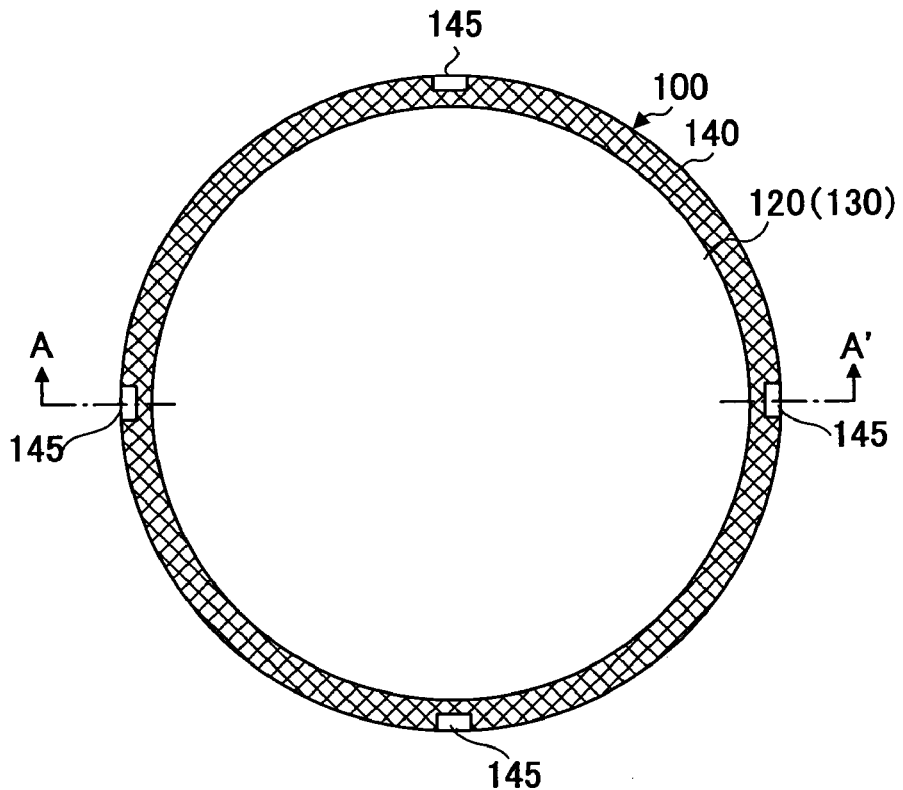
FIG. 13 is a top view of the semiconductor substrate for explaining the plating method of forming the routing patterns continued from FIG. 12 according to the embodiment of the present invention.

FIG. 13 is a top view of the semiconductor substrate for explaining the plating method of forming the routing patterns continued from FIG. 12 according to the embodiment of the present invention.

Figure 14:
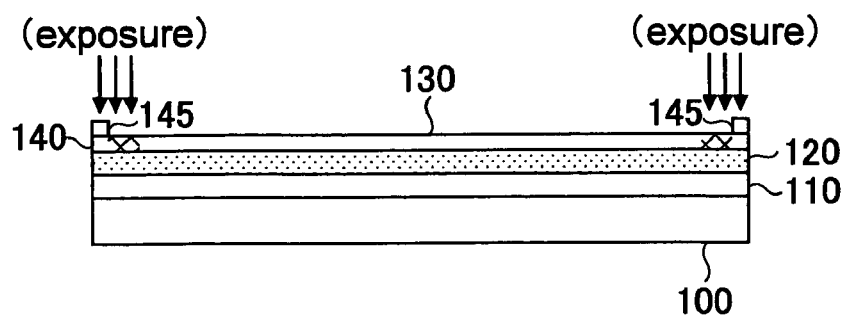
FIG. 14 is a cross-sectional view of the semiconductor substrate in FIG. 13 along the line AA'.

FIG. 14 is a cross-sectional view of the semiconductor substrate in FIG. 13 along the line AA'.

In step four, as illustrated in FIG. 13 and FIG. 14, the second exposure is carried out. Specifically, in the second exposure, light for exposure, such as ultraviolet rays, is irradiated onto the peripheral portion of the negative resist layer 120. In this process, the second exposure is executed with the light shielding layer 145 being present. In addition, the second exposure is performed with focused light from a laser diode.

In step four, the exposed region is indicated by meshes in FIG. 13, and this region is referred to as "peripheral exposure region 140". The peripheral exposure region 140 corresponds to a ring-shaped portion at the edge of the negative resist layer 120 on the semiconductor wafer 100.

As described above, portions of the negative resist layer 120 irradiated by the ultraviolet rays become insoluble or hardly soluble in the developing solution. That is, by step four, the peripheral portion of the negative resist layer 120 (the peripheral exposure region 140) become insoluble or hardly soluble in the developing solution, forming a ring-shaped portion. But the portion of the negative resist layer 120 corresponding to the light shielding layer 145 remains soluble to the developing solution.

For example, the width of the peripheral exposure region 140 along the radial direction of the semiconductor wafer 100 may be set to be 3 mm to 4 mm.

After step four is finished, step five of the plating method according to the present embodiment is executed to perform developing.

In step five, the protection film 130, which is pasted on the negative resist layer 120, is removed. Then, the semiconductor wafer 100 is immersed into the developing solution for developing.

As described above, the exposed portions of the negative resist layer 120 in step three (first exposure) and step four (second exposure) are insoluble or hardly soluble in the developing solution, and remain on the conductive layer 110 even after developing. Meanwhile, the un-exposed portions of the negative resist layer 120 in step three and step four are soluble in the developing solution, and are removed in the developing step. These unexposed portions include the portions of the negative resist layer 120 corresponding to positions where the plating pattern 150 is to be formed, and the portion of the negative resist layer 120 corresponding to positions of the power feeding electrode 115.

Figure 15:
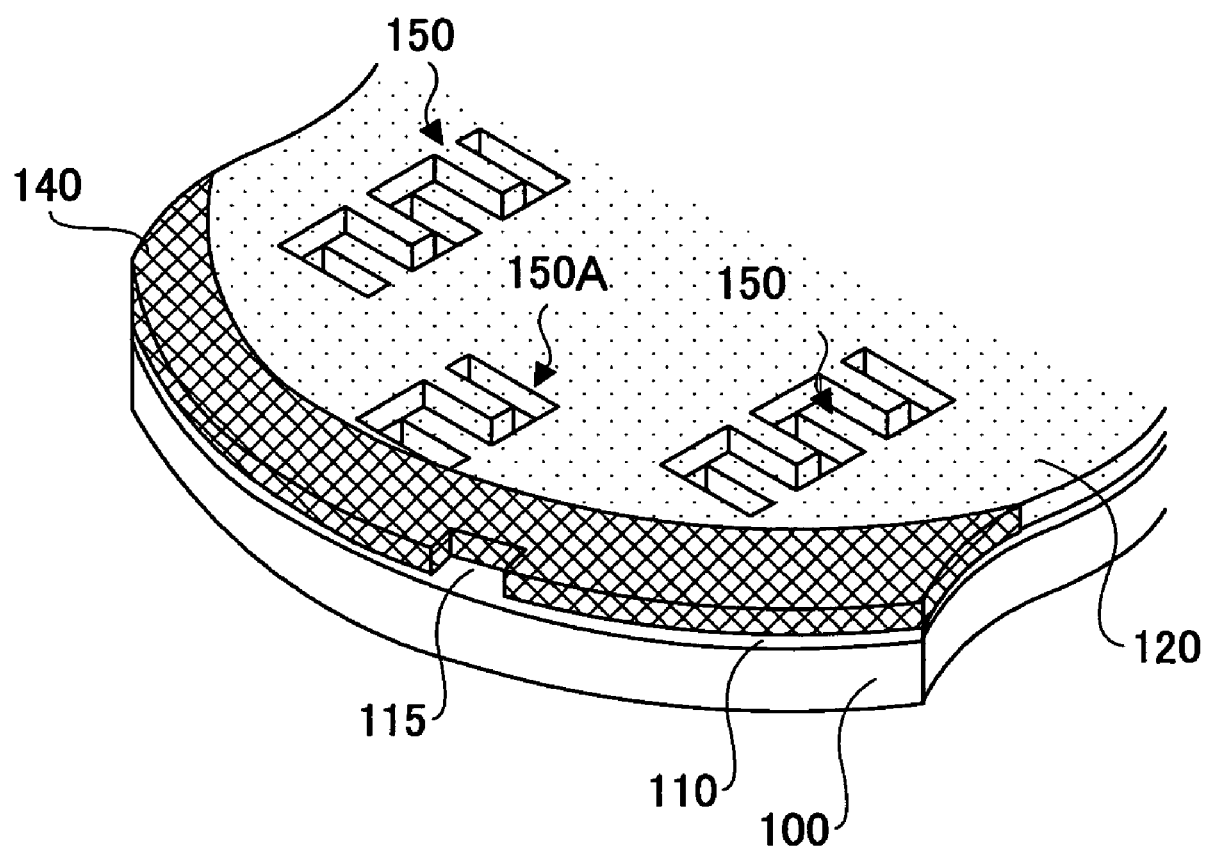
FIG. 15 is an enlarged perspective view of the peripheral portion of the semiconductor substrate after step five is finished according to the embodiment of the present invention.

FIG. 15 is an enlarged perspective view of the peripheral portion of the semiconductor substrate after step five is finished according to the embodiment of the present invention.

As illustrated in FIG. 15, by the developing treatment, plural plating patterns 150 are formed in the negative resist layer 120. In addition, the peripheral exposure region 140 is formed to have a ring shape at the edge of the negative resist layer 120. In addition, the power feeding electrode 115 is formed at specified positions. The power feeding electrode 115 is formed at outer edge of the peripheral exposure region 140, and has a width less than the width of the peripheral exposure region 140.

Because of presence of the peripheral exposure region 140, even the groove-like plating pattern 150A at the edge of the semiconductor wafer 100 is not in communication with the outside. That is, the portion, where the communication portion 651 is formed otherwise in the related art, is included in the peripheral exposure region 140 in the present embodiment, and this portion is not developed and is not removed. That is, the peripheral exposure region 140 functions as a dam to prevent the plating pattern 150A from being in communication with the outside.

After step five is finished, step six of the plating method according to the present embodiment is executed to perform plating. In step six, first, the semiconductor wafer 100 having the plating patterns 150 is mounted on a plating jig 160. The plating jig 160 roughly includes a mask jig 161 and a rear lid jig 162.

FIG. 16A and FIG. 16B are a plan view and a cross-sectional side view, respectively, of the mask jig 161 in the plating jig 160 used in the plating method according to the embodiment of the present invention.

As illustrated in FIG. 16A and FIG. 16B, the mask jig 161 has mask body 163, in which an opening 164 is formed at a position slightly lower than the center. For example, the mask body 163 is formed from a resin. External connection terminals 165 are arranged above the mask body 163, and a sealing rubber 167 and power feeding terminals 166 are arranged surrounding the opening 164 with the sealing rubber 167 and the power feeding terminals 166 being in ring shapes.

The external connection terminals 165 and the power feeding terminals 166 are electrically connected. In addition, the power feeding terminals 166 are arranged on the outer side of the sealing rubber 167.

In addition, plural screw holes 168 are formed at positions on the outer side of the opening 164. When fixing the rear lid jig 162, screws (not-illustrated) are screwed into these screw holes 168.

Figure 17A:
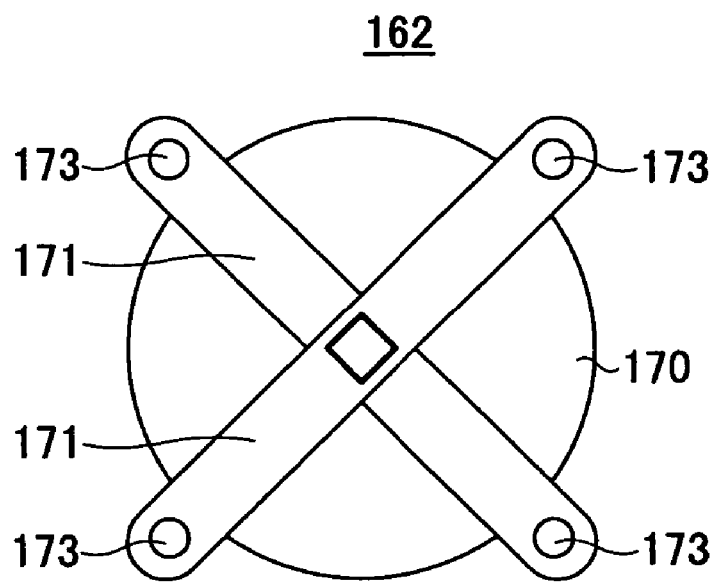
FIG. 17A and FIG. 17B are a plan view and a cross-sectional side view, respectively, of a rear lid jig 162 in the plating jig 160 used in the plating method according to an embodiment of the present invention.
Figure 17B:
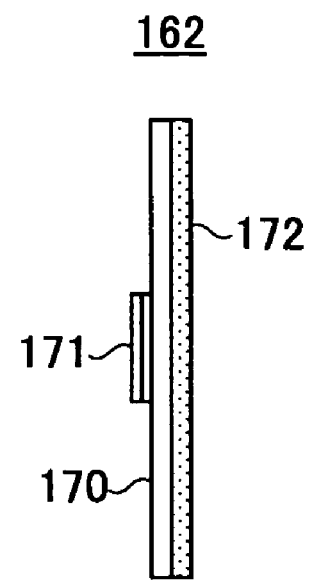

FIG. 17A and FIG. 17B are a plan view and a cross-sectional side view, respectively, of a rear lid jig 162 in the plating jig 160 used in the plating method according to an embodiment of the present invention.

As illustrated in FIG. 17A and FIG. 17B, the rear lid jig 162 includes a lid body 170 and fixing frames 171. The lid body 170 is disk-shaped, and the size thereof is set to be larger than the diameter of the semiconductor wafer 100. In addition, a rear sealing rubber 172 is arranged on the back side of the body 170.

The rear sealing rubber 172 has a sufficiently large area so that it touches the whole rear surface of the semiconductor wafer 100 when mounting the semiconductor wafer 100 in a way described below. Further, penetration holes 173 are formed at ends of plural fixing frames 171 (in the present embodiment, there are two fixing frames 171).

Figure 18:
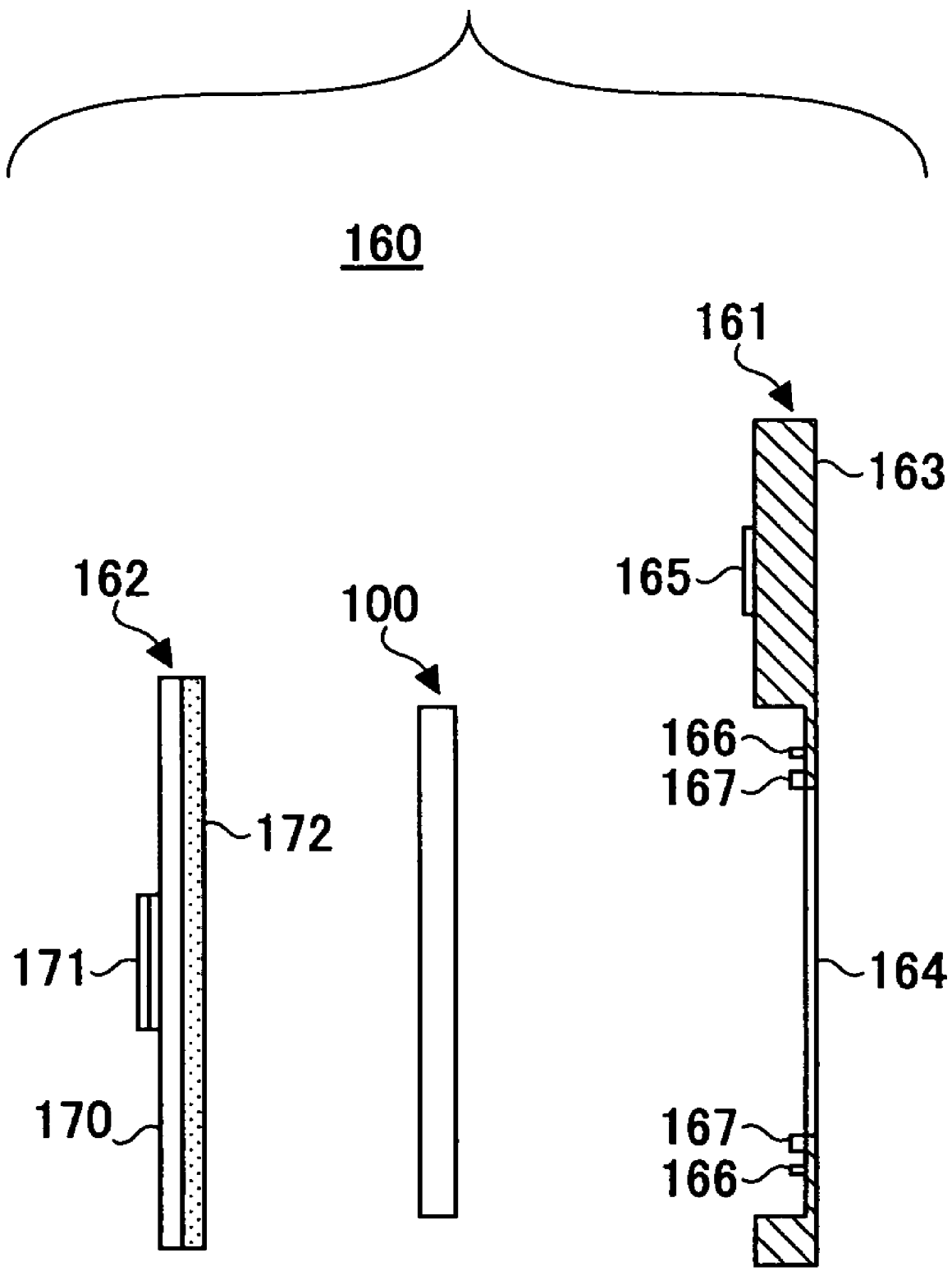
FIG. 18 is a cross-sectional side view illustrating a method of assembling the plating jig 160 used in the plating method according to the embodiment of the present invention.
Figure 19:
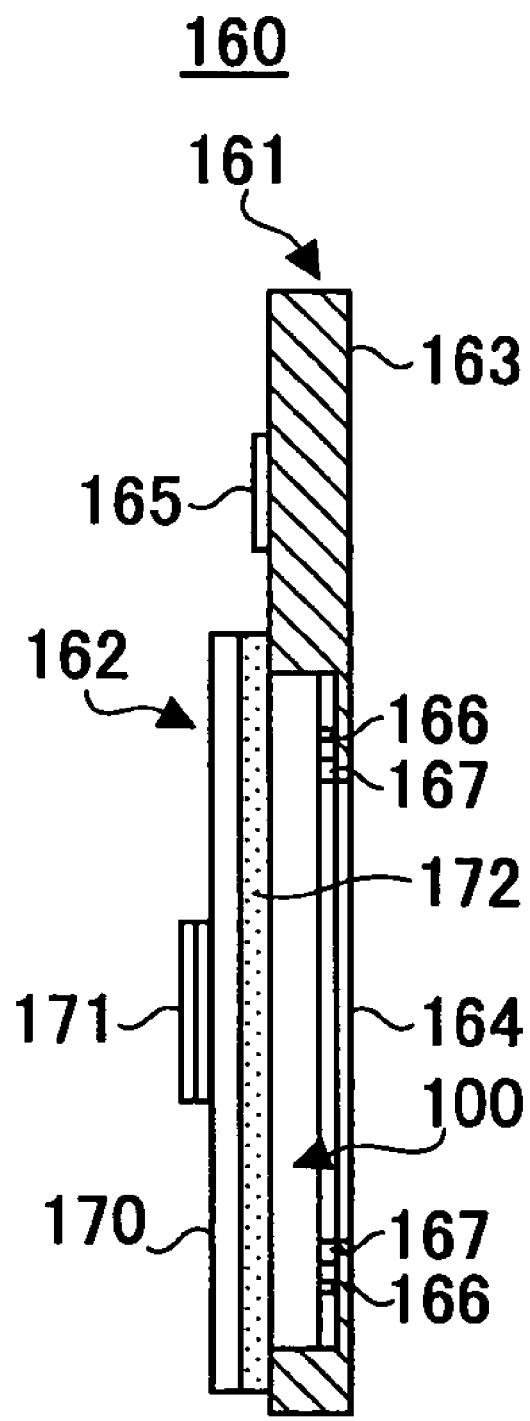
FIG. 19 is a cross-sectional side view illustrating the plating jig 160 with the semiconductor wafer 100 being mounted therein.

Next, a description is made of a procedure of mounting the semiconductor wafer 100 on the plating jig 160 with reference to FIG. 18 and FIG. 19.

FIG. 18 is a cross-sectional side view illustrating a method of assembling the plating jig 160 used in the plating method according to the embodiment of the present invention.

FIG. 19 is a cross-sectional side view illustrating the plating jig 160 with the semiconductor wafer 100 being mounted therein.

In order to mount the semiconductor wafer 100 on the plating jig 160, first, the semiconductor wafer 100 should be mounted on the mask jig 161.

When mounting the semiconductor wafer 100 on the mask jig 161, the surface of the semiconductor wafer 100 with the negative resist layer 120 is arranged to face the sealing rubber 167. In addition, in this process, the sealing rubber 167 is positioned so that the whole sealing rubber 167 can touch the semiconductor wafer 100, and the power feeding electrodes 115 formed on the semiconductor wafer 100 are positioned so as to be connected with the power feeding terminals 166.

Next, not-illustrated screws are used to fix the rear lid jig 162 to face the mask jig 161 on which the semiconductor wafer 100 is mounted. In this step, the rear sealing rubber 172 on the back side of the body 170 is arranged to touch the whole rear surface of the semiconductor wafer 100.

In this way, as illustrated in FIG. 19, the semiconductor wafer 100 is mounted on the plating jig 160.

When the semiconductor wafer 100 is mounted on the plating jig 160 as illustrated above, the plating treatment is executed on the semiconductor wafer 100.

Figure 20:
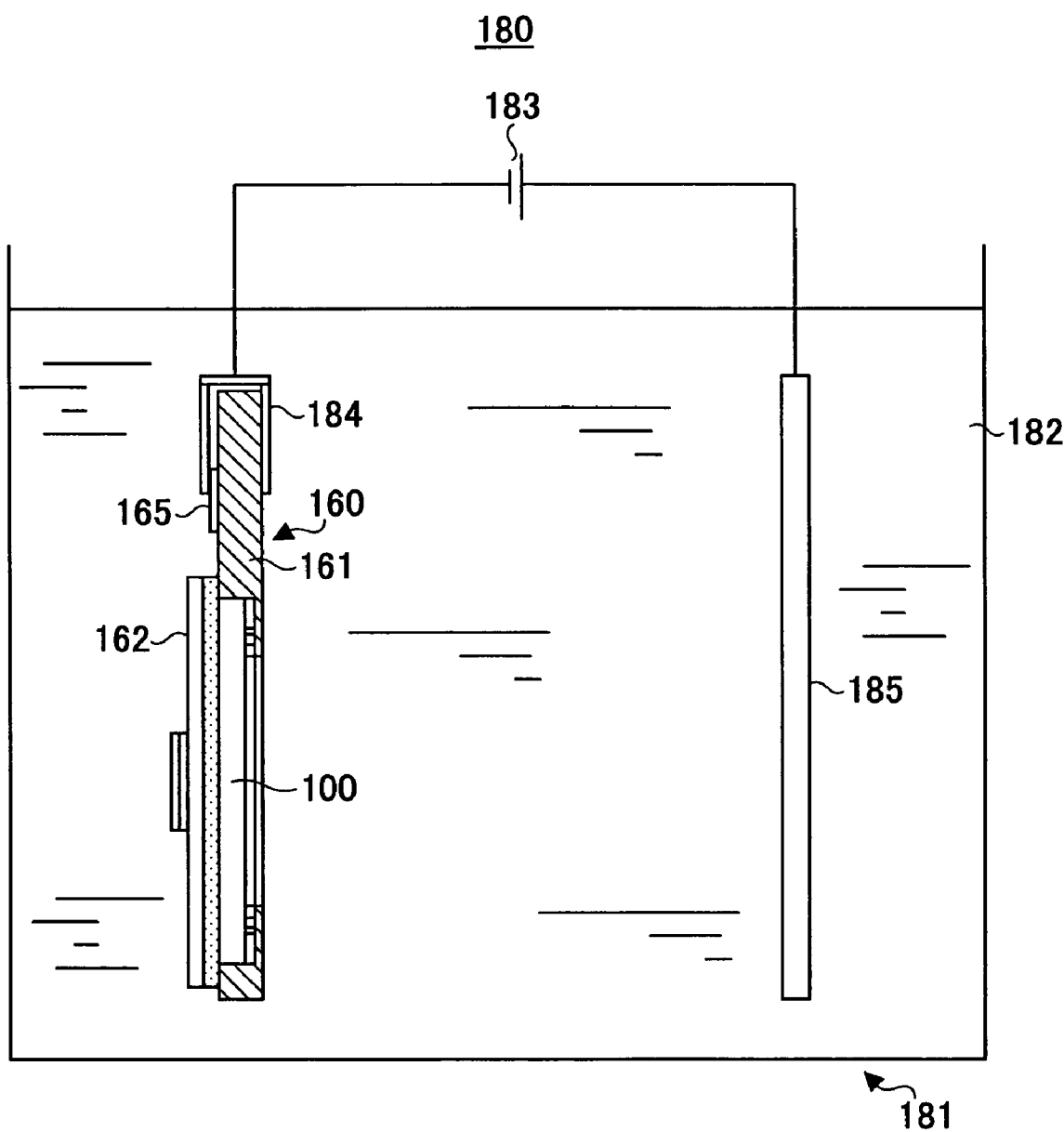
FIG. 20 is a schematic view illustrating a plating device and the plating method according to the embodiment of the present invention.

FIG. 20 is a schematic view illustrating a plating device and the plating method according to the embodiment of the present invention.

In FIG. 20, a plating device 180 for plating the semiconductor wafer 100 (electro-plating) includes a plating tank 181, a power supply, a cathode 184, and an anode 185. Here, as an example, copper plating is described. Hence, a plating solution 182 includes copper ions, and the anode 185 is made from copper.

The cathode 184 is connected to the external connection terminals 165 of the plating jig 160. Hence, the cathode 184 is electrically connected with the conductive layer 110 through the external connection terminals 165, the power feeding terminals 166, and the power feeding electrodes 115 (as a part of the conductive layer 110). In addition, the conductive layer 110 is exposed at the positions where the plating pattern 150 of the negative resist layer 120 is formed. Hence, copper ions are deposited on the conductive layer 110 which has negative polarity, and the rerouting pattern is formed in the plating pattern 150.

Figure 21:
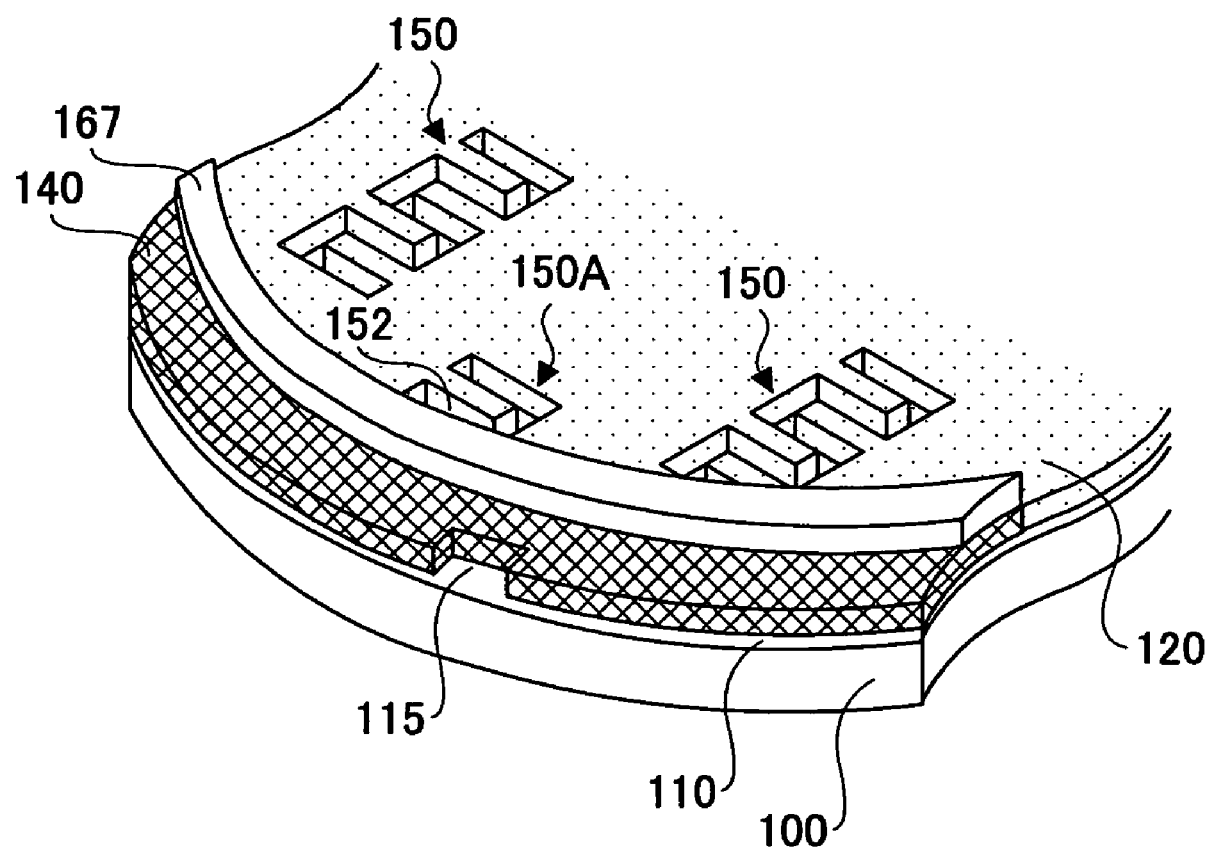
FIG. 21 is an enlarged perspective view of the semiconductor wafer 100 mounted on a plating jig 160.

FIG. 21 is an enlarged perspective view of the semiconductor wafer 100 mounted on a plating jig 160.

FIG. 21 illustrates an enlarged peripheral portion of the semiconductor wafer 100 mounted on a plating jig 160. For convenience of illustration and explanation, only a sealing rubber 167 of the plating jig is shown in FIG. 21.

In the present embodiment, as described above, in step four (the second exposure step), the peripheral portion of the negative resist layer 120 is exposed, hence, the peripheral exposure region 140 is formed in a ring shape at the edge of the negative resist layer 120 on the semiconductor wafer 100. The peripheral exposure region 140 functions as a dam, and the outer side of the plating pattern 150A at the edge of the semiconductor wafer 100 is blocked by the peripheral exposure region 140, and the inner side 152 of the plating pattern 150A at the edge of the semiconductor wafer 100 is blocked by the peripheral exposure region 140, Further, the contacting position of the sealing rubber 167 on the semiconductor wafer is not set on the inner side of the peripheral exposure region 140. Specifically, the sealing rubber 167 is on the peripheral exposure region 140, and on the inner side of the power feeding electrodes 115.

Because of such a configuration, as illustrated in FIG. 21, even when the plating jig 160 with the semiconductor wafer 100 being mounted is immersed into the plating solution 182, the plating solution 182 cannot leak out to the outside of the sealing rubber 167 through the plating pattern 150A.

Therefore, it is possible to prevent the plating solution 182 from eroding the power feeding terminal 166, which forms the plating jig 160, in addition, it is also possible to prevent adhesion of the plating solution 182 to the back surface of the semiconductor wafer 100. Further, even when the negative resist layer 120 is a DFR thicker than 10 μm, because of the presence of the peripheral exposure region 140, it is possible to reliably prevent leakage of the plating solution 182 in the plating step.

For example, in the present embodiment, the thickness of the negative resist layer 120 is set to be 30 μm. It is found that even when the thickness of the negative resist layer 120 is from 35 μm to 40 μm, it is possible to reliably prevent leakage of the plating solution 182 in the plating step.

After the step six (plating) is finished, the negative resist layer 120 and the peripheral exposure region 140 are removed. In this way, the semiconductor wafer 100 is formed to include routing patterns having shapes in correspondence to the shape of the plating pattern 150.

While the present invention has been described with reference to specific embodiments chosen for purpose of illustration, it should be apparent that the invention is not limited to these embodiments, but numerous modifications could be made thereto by those skilled in the art without departing from the basic concept and scope of the invention.

For example, in the above, the present invention is described while taking formation of the rerouting patterns as an example. However, the present invention is not limited to rerouting patterns; it is applicable to formation of conductive posts, bumps, or the like by electrolytic plating.

According to the present invention, it is possible to reliably prevent leakage of a plating solution through a plating pattern in a plating step.

This patent application is based on Japanese Priority Patent Application No. 2004-069421 filed on Mar. 11, 2004, the entire contents of which are hereby incorporated by reference.

What is claimed is:

1. A plating method, comprising the steps of:
   forming a conductive layer on a semiconductor wafer;
   forming a negative resist layer on the conductive layer,
   exposing, for a predetermined pattern, the negative resist layer with a projection lithography stepper, at a center portion and a peripheral portion of the negative resist layer;
   exposing the peripheral portion of the negative resist layer for a ring shape after the step of exposing the negative resist layer with the projection lithography stepper;
   developing the exposed negative resist layer to form a predetermined plating pattern after the step of exposing the peripheral portion of the negative resist layer; and
   performing plating on the plating pattern.

2. The method as claimed in claim 1, wherein the negative resist layer is thicker than 10μm.

3. The method as claimed in claim 2, wherein the negative resist layer is formed from a dry film resist.

4. The method as claimed in claim 1, wherein in the step of performing plating, a sealing plating jig is used.

* * * * *